United States Patent [19]

Yoshida et al.

[11] 4,430,610
[45] Feb. 7, 1984

[54] NON-GROUNDING CHECKING SYSTEM

[75] Inventors: Kenichi Yoshida; Junichi Hiramoto; Shinya Takenaka, all of Osaka, Japan

[73] Assignee: Sumitomo Electric Industries, Ltd., Osaka, Japan

[21] Appl. No.: 333,509

[22] Filed: Dec. 22, 1981

[30] Foreign Application Priority Data

Dec. 22, 1980 [JP] Japan .................................. 55-180471

[51] Int. Cl.³ ............................................ G01R 31/02
[52] U.S. Cl. ................................................... 324/51
[58] Field of Search ........................ 324/51; 361/41, 45

[56] References Cited

U.S. PATENT DOCUMENTS

| 2,737,765 | 6/1973 | Lee et al. | 324/51 |
| 3,492,567 | 1/1970 | Rissolo | 324/51 |
| 4,352,058 | 9/1982 | Westra | 324/51 |

Primary Examiner—Stanley T. Krawczewicz
Attorney, Agent, or Firm—Sughrue, Mion, Zinn, Macpeak & Seas

[57] ABSTRACT

The grounding of an electrical apparatus is monitored by a primary circuit which is inductively coupled to a coil connected in series between the grounding line of the power cord and a grounding terminal on the electrical apparatus to which a second grounding line is connected.

4 Claims, 1 Drawing Figure

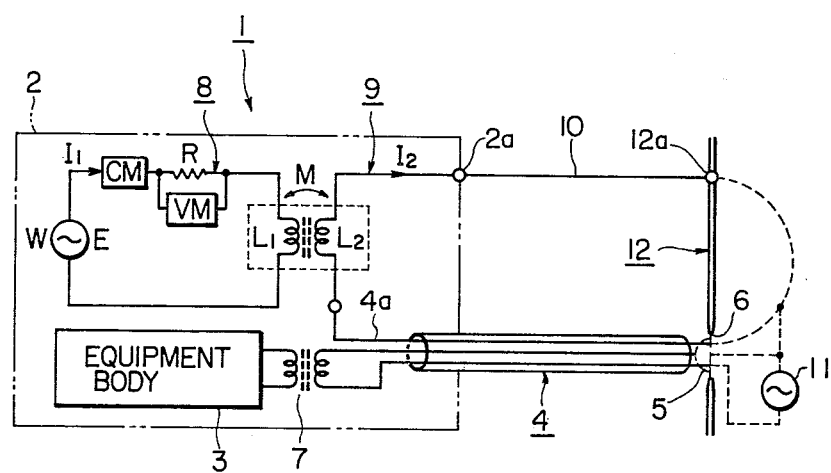

NON-GROUNDING CHECKING SYSTEM

BACKGROUND OF THE INVENTION

This invention relates to a system of detecting whether or not electrical equipment is satisfactorily grounded (hereinafter referred to as "a non-grounding checking system"), which can be effectively applied to electrical equipment which should be grounded.

In general, electrical equipment has a grounding terminal for both security and stability of operation. Recently, electrical equipment has been employed in a variety of industrial fields, some of which require that the electrical equipment be especially positively grounded. Such electrical equipment is for instance ME (medical electronic) equipment, or equipment including a high voltage circuit. When electrical equipment of this type is used, the equipment has heretofore been grounded by connecting the housing of the electrical equipment to a grounding line, by inserting the plug of a power cord, which has a grounding line in addition to power supplying lines, into a receptacle provided on the power supply side so that the grounding line is connected to the grounding line which is provided on the power supply side. The electrical equipment can be operated after being grounded this way, but if the grounding line is broken or the grounding work for the receptacle on the power supply side is unsatisfactory, unexpected accidents could be caused. No effective countermeasure against this trouble has yet been provided.

SUMMARY OF THE INVENTION

In view of the foregoing, an object of this invention is to provide a non-grounding checking system by which it can be detected whether or not electrical equipment is positively grounded. Briefly, according to this invention, a primary circuit having an electrical source and a primary coil is coupled to a secondary coil through a mutual inductance, and one end of the secondary coil is connected to the grounding line in a power cord, while the other end is connected to a grounding terminal on the housing of the electrical equipment, so that a current or a voltage in the primary circuit is monitored.

BRIEF DESCRIPTION OF THE DRAWINGS

One preferred embodiment of this invention will be described with reference to the accompanying drawing which is a circuit diagram of one embodiment of this invention.

DETAILED DESCRIPTION OF THE INVENTION

As shown in the single FIGURE in the accompanying drawings, a predetermined voltage is supplied through a power transformer 7 to an electrical equipment body 3, such as a ME (medical electronic) equipment body, which is incorporated in the housing 2 of electrical equipment 1, when the plug 5 of a power cord 4 is inserted into a receptacle 6. A primary circuit 8 according to a non-grounding checking system of this invention forms a closed loop circuit consisting of an electrical source E, a resistor R and a coil $L_1$ connected in the stated order, and is placed together with the electrical equipment body 3 in the housing 2. The electrical source E may be one in the electrical equipment body 3, or may be provided independently. A coil $L_2$ is placed within the housing 2 and forms a secondary circuit 9 which is coupled to the coil $L_1$ through a mutual inductance M. One end of the coil $L_2$ is connected to a grounding line 4a of the power cord 4, and the other end is connected to a grounding terminal 2a on the housing 2, to which another grounding line 10 is connected.

When the plug 5 of the power cord 4 is inserted into the receptacle 6, the electrical equipment 1 is connected to the AC source 11 and the grounding line 4a is automatically grounded. The plug 5 and the receptacle 6 are of the three terminal type, and one of the three terminals is used for grounding. On the other hand, the grounding line 10 is connected to a grounding terminal 12a on a floor 12. Thus, in the normal state, the grounding lines 4a and 10 are both grounded through a small earth resistance. In other words, when the electrical equipment is positively grounded, both ends of the coil $L_2$ are short-circuited by the grounding lines 4a and 10. Therefore, by monitoring a current $I_1$ flowing in the primary circuit 8 or a voltage developed across the resistor R, it can be determined whether or not the grounding circuit is satisfactory.

This will be described in more detail by analyzing the primary circuit 8 and the secondary circuit 9.

If it is assumed that, in the primary circuit 8, the resistance of the resistor R is $R_1$, and the inductance of the coil $L_1$ is $L_1$, and in the secondary circuit 9 the resistance is $R_2$ and the inductance of the coil $L_2$ is $L_2$, and that the mutual inductance M of the coils $L_1$ and $L_2$ is M, then a drive point impedance Z as viewed from both ends of the electrical source E can be represented by the following expression (1)

$$Z = R_1 + \frac{\omega^2 M^2 R_2}{R_2^2 + \omega^2 L_2^2} + j\omega \left( L_1 - \frac{\omega^2 M^2 L_2}{R_2^2 + \omega^2 L_2^2} \right) \quad (1)$$

In practice, the secondary circuit 9 is either shorted (when the grounding is satisfactory) or released (when the grounding is unsatisfactory) and accordingly either the resistance $R_2 = 0$ (in the normal state) or $R_2 = \infty$ (in the abnormal state). If these conditions are inserted into the expression (1), then when $\quad R_2 = 0$ $$Z_O = R_1 + j\omega \left( L_1 - \frac{M^2}{L_2} \right) \quad (2)$$

when $\quad R_2 = \infty$
$$Z_\infty = R_1 + j\omega L_1 \quad (3)$$

The ratio of $Z_0$ to $Z_\infty$ is as follows:

$$\frac{Z_O}{Z_\infty} = \frac{R_1 + j\omega \left( L_1 - \frac{M^2}{L_2} \right)}{R_1 + j\omega L_1} = 1 - \frac{k^2}{1 + \frac{R_1}{j\omega L_1}} \quad (4)$$

(where k is the coupling coefficient, and $$k^2 = \frac{M^2}{L_1 L_2} \leq 1)$$

In order to make the expression (4) substantially equal to zero, the circuit is preferably designed such that $k=1$ and $R_1/j\omega L_1 \to 0$. In this case, $Z_\infty$ will be much larger than $Z_0$, and the current $I_1$ will change significantly between $R_0$ and $R_\infty$. Thus, this should be monitored. That is, if the current value monitored by current meter CM becomes smaller than the current $I_1$ which should exist when $R_2=0$, it can be determined that the electrical equipment is not grounded or the grounding lines 4a and 10 are broken. The same effect can be obtained by monitoring the voltage across the resistor R via a voltage meter VM. In this case, a detecting circuit for detecting the current $I_1$ or the voltage across the resistor R may be provided in the primary circuit 8, and a warning and displaying circuit or a power circuit breaker may be connected to the detecting circuit.

As was described in detail above, according to this invention, the unsatisfactory grounding of electrical equipment can be positively detected. Therefore, unexpected accidents due to electrical shock can be prevented. The non-grounding checking system according to the invention is especially applicable to ME (medical electronic) equipment.

What is claimed is:

1. In an electrical apparatus having a power cord with a first grounding line therein, said apparatus having a grounding terminal to which a second grounding line is connected, a non-grounding checking circuit comprising:
    a primary circuit including a primary coil and electrical source for providing a current through said primary coil;
    a secondary coil connected in series between said first grounding line and grounding terminal inductively coupled to said primary coil, the impedance of said primary circuit indicating the grounding state of said electrical apparatus; and
    means for detecting a magnitude of said current in said primary coil to provide an indication of said grounding state.

2. A non-grounding checking circuit as claimed in claim 1, wherein said detecting means comprises a resistor connected in series with said primary coil and electric source means.

3. A non-grounding checking circuit as claimed in claim 2, wherein said detecting means further comprises means for monitoring the voltage across the resistor.

4. A non-grounding checking circuit as claimed in claim 2, wherein said detecting means further comprises means for monitoring the current through said resistor.

* * * * *